United States Patent [19]

Grupen-Shemansky et al.

[11] Patent Number: 5,346,848

[45] Date of Patent: Sep. 13, 1994

[54] METHOD OF BONDING SILICON AND III-V SEMICONDUCTOR MATERIALS

[75] Inventors: Melissa E. Grupen-Shemansky, Phoenix; Bertrand F. Cambou, Mesa, both of Ariz.

[73] Assignee: Motorola, Inc., Schaumburg, Ill.

[21] Appl. No.: 70,068

[22] Filed: Jun. 1, 1993

[51] Int. Cl.⁵ .......................................... H01L 21/302
[52] U.S. Cl. ...................... 437/61; 437/225; 437/974; 148/DIG. 12; 148/DIG. 135
[58] Field of Search .................. 437/61, 62, 63, 64, 437/974, 225, 86, 131, 132; 148/DIG. 12, DIG. 135

[56] References Cited

U.S. PATENT DOCUMENTS

| | | |
|---|---|---|
| 3,508,980 | 4/1970 | Jackson et al. |
| 3,559,282 | 2/1971 | Lesk . |
| 4,771,016 | 9/1988 | Bajor et al. .................. 148/DIG. 12 |
| 4,784,970 | 11/1988 | Solomon ..................... 437/86 |
| 5,006,487 | 4/1991 | Stokes ........................ 148/DIG. 12 |
| 5,064,781 | 11/1991 | Cambou et al. . |
| 5,081,061 | 1/1992 | Rouse et al. ................ 437/86 |
| 5,084,408 | 1/1992 | Baba et al. .................. 437/62 |
| 5,091,330 | 2/1992 | Cambou et al. . |
| 5,102,821 | 4/1992 | Moslehi ...................... 148/DIG. 135 |
| 5,210,052 | 5/1993 | Takasaki ..................... 437/247 |
| 5,240,883 | 8/1993 | Abe et al. .................... 437/62 |

FOREIGN PATENT DOCUMENTS

| | | | |
|---|---|---|---|
| 0112543 | 1/1989 | Japan | 148/DIG. 12 |
| 1238033 | 9/1989 | Japan | 437/62 |
| 1295446 | 11/1989 | Japan | 148/DIG. 12 |
| 0245953 | 2/1990 | Japan | 148/DIG. 12 |
| 3132055 | 6/1991 | Japan | 148/DIG. 12 |
| 4162630 | 6/1992 | Japan | 148/DIG. 12 |
| 2206445 | 1/1989 | United Kingdom | 148/DIG. 12 |

OTHER PUBLICATIONS

M. Grupen-Shemansky et al, "Stress in GaAs Bonded to Si," Proceedings of the First International Symposium on Semiconductor Wafer Bonding: Science, Technology, and Applications, Oct. 1991, pp. 132–145.

Q. A. Huang et al, "Gallium Arsenide on Insulator by Electrostatic Bonding," 1989 IEEE SOS/SOI Technology Conference, Oct. 3–5, 1989, pp. 62–63.

G. G. Goetz et al. "Heterostructures by Generalized Bonding Techniques," Proceedings of the Fourth International Symposium on Silicon-on-Insulator Technology and Devices, The Electrochemical Society, vol. 90-6, pp. 247–251, (1989).

V. Lehmann et al, "Bubble-Free Water Bonding of GaAs and InP on Silicon in a Microcleanroom," pp. L2141–L2143, Nov. 1989.

Primary Examiner—Tom Thomas
Assistant Examiner—Michael Trinh
Attorney, Agent, or Firm—Miriam Jackson

[57] ABSTRACT

A silicon wafer and a III-V semiconductor wafer are bonded together through a bonding interlayer which is deposited on the III-V semiconductor wafer. By forming the bonding interlayer on the III-V semiconductor wafer, rather than the silicon wafer, the bonding process is facilitated, creating a sufficiently strong bond to carry out further processing. The III-V semiconductor wafer is thinned to relieve stress after the bonding procedure. The bonded wafers may be subjected to a second bonding procedure to increase the bond strength. The bonded wafers can then be subjected to high temperature processing used in semiconductor device fabrication.

9 Claims, 3 Drawing Sheets

METHOD OF BONDING SILICON AND III-V SEMICONDUCTOR MATERIALS

BACKGROUND OF THE INVENTION

This invention relates, in general, to semiconductor wafer bonding, and more particularly, but not limited to, a method of bonding a silicon wafer to a III-V semiconductor wafer.

Bonding of III-V semiconductor materials to silicon has been disclosed in the past. When bonding alternate materials to silicon, the thermal expansion mismatch and induce stresses become critical factors. It is important to relieve these induced stresses to allow for normal processing temperatures used to fabricate semiconductor devices to be used. In the past, these stresses have not been adequately relieved, therefore, the process of bonding dissimilar materials must be optimized.

Accordingly, it would be desirable to provide an improved method of bonding a III-V semiconductor material to a silicon wafer so that subsequent processing of devices on these materials can successfully take place.

SUMMARY OF THE INVENTION

A method of bonding a silicon wafer and a III-V semiconductor wafer comprises providing a silicon wafer having a first and a second major surface and providing a III-V semiconductor wafer having a first and a second major surface. A bonding interlayer is formed on the first major surface of the III-V semiconductor wafer. The silicon wafer and the III-V semiconductor wafer are bonded together by using a first thermal or a thermo-anodic bonding process, such that the bonding interlayer is positioned between the III-V semiconductor wafer and the first surface of the silicon wafer. A portion of the III-V semiconductor wafer is removed from the second surface of the III-V semiconductor wafer.

DETAILED DESCRIPTION OF THE DRAWINGS

Figure 1:
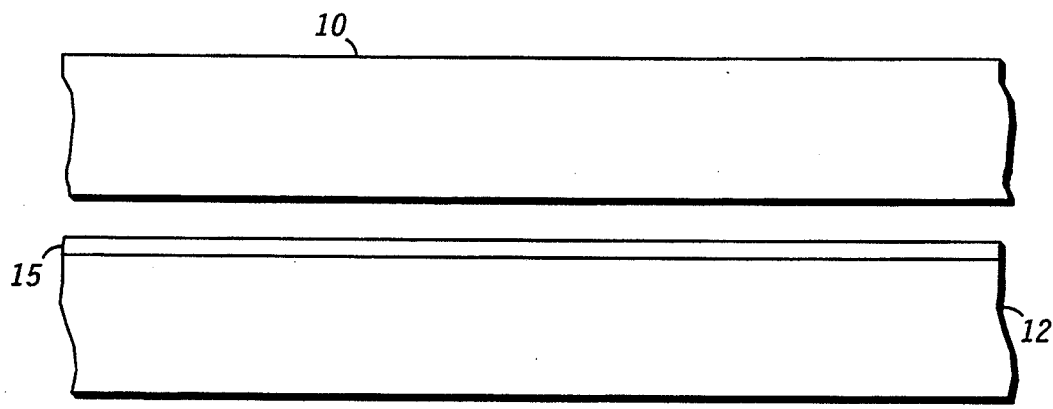
FIG. 1 illustrates an embodiment of the present invention in a beginning stage of fabrication.

FIG. 1 illustrates a first embodiment of the present invention. What is shown is a silicon material or wafer 10 to be bonded to a III-V semiconductor material or wafer 12 having a bonding interlayer 15 formed thereon. Bonding interlayer 15 is preferably comprised solely or a combination of silicon dioxide, doped silicon dioxide, silicon nitride, polysilicon, or amorphous silicon. These layers can be formed using a variety of processes known in the art. Most preferably, bonding interlayer 15 consists essentially of a silicon nitride layer formed on III-V semiconductor wafer 12 and a silicon dioxide layer formed on the silicon nitride layer. It is important to note that bonding interlayer 15 must be deposited on III-V semiconductor wafer 12, and not on silicon wafer 10, to insure that a uniform, strong bond is achieved, because interlayer 15 bonds more easily to a silicon material under thermal or anodic bonding. Deposition of bonding interlayer 15 on III-V semiconductor wafer 12 can be carried out in, for example, a reactor available from Novellus under the trade name of "Novellus Concept One." After bonding interlayer 15 is formed on III-V semiconductor wafer 12, it must be cleaned before bonding. An $NH_4OH:H_2O$ clean for silicon dioxide as bonding interlayer 15 has proven to yield satisfactory bonding results.

Figure 2:
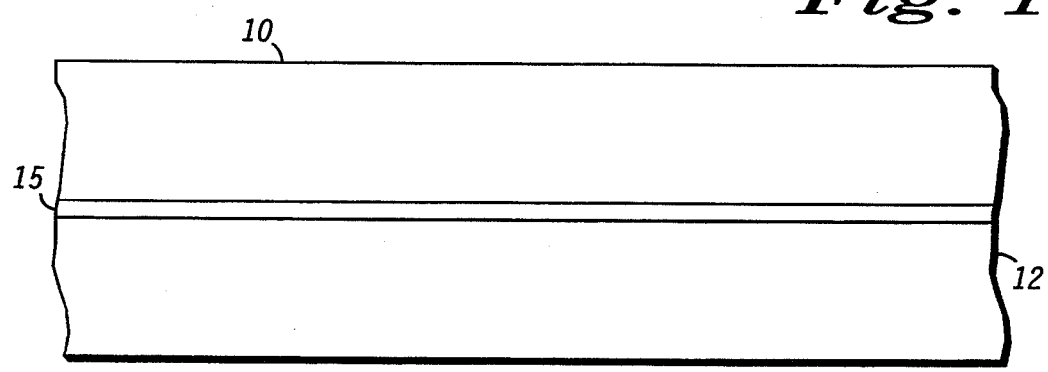
FIG. 2 illustrates the embodiment of FIG. 1 in a further stage of fabrication.

FIG. 2 illustrates the structures of FIG. 1 in a further stage of fabrication. Silicon wafer 10 is bonded to bonding interlayer 15. The bonding process is critical to achieve a uniform, sufficiently strong bond. A thermal or thermo-anodic bonding process is used with a temperature of less than approximately 200° C. At this temperature, a sufficiently strong bond can be created between bonding interlayer 15 and silicon wafer 10 for further processing as described below. A temperature much higher than 200° C. is not desirable at this point in the processing because it may result in the formation of stress fractures in III-V semiconductor wafer 12.

After the low temperature bonding, III-V semiconductor wafer 12 is thinned to decrease the magnitude of the maximum stress points created by the bonding process. In a preferred embodiment, III-V semiconductor wafer 12 is thinned from a thickness of approximately 625 microns to approximately ten's of microns or greater. More preferably, silicon wafer 10 is also thinned to decrease the overall stress in III-V semiconductor wafer 12. Silicon wafer 10 is preferably thinned to a thickness of approximately 150 microns or greater from a thickness of approximately 550 microns.

The first bonding process imparts enough strength in the bond to allow for thinning of III-V semiconductor wafer 12 and/or silicon wafer 10. The thinning process relieves enough stress so that the bonded silicon wafer 10 and III-V semiconductor wafer 12 can be subjected to high temperature processing involved in semiconductor device fabrication, without stress fractures being formed in III-V semiconductor wafer 12. Before proceeding with high temperature processing, the bond strength is preferably increased by a second thermal or thermo-anodic bonding process as disclosed above.

Figure 3:
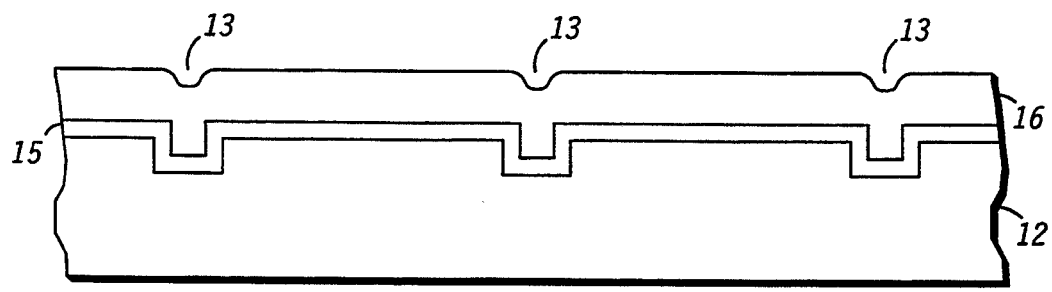
FIG. 3 illustrates a second embodiment of the present invention in a beginning stage of fabrication.

FIG. 3 illustrates a second embodiment of the present invention. What is shown is a III-V semiconductor wafer 12 having a plurality of trenches 13 formed therein by standard photolithography and etch processes. The bonding interlayer 15 is then formed on III-V semiconductor wafer 12 and in trenches 13 by a deposition process. In the preferred embodiment, bonding interlayer 15 is comprised of a nitride/oxide layer. After bonding interlayer 15 is formed, a planarizable layer 16 is formed to refill trenches 13. If necessary, planarizable layer 16 is planarized (not shown). Planarizable layer 16 may be comprised of polysilicon, silicon nitride, silicon dioxide, or a reflowable glass.

Figure 4:
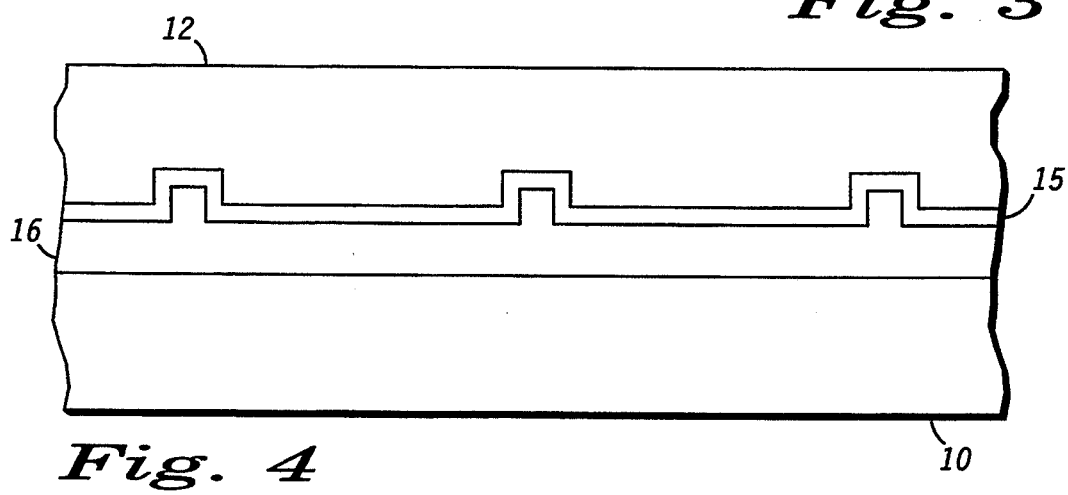
FIG. 4 illustrates the structures of FIG. 3 in a further stage of fabrication.

FIG. 4 illustrates the structure of FIG. 3 in a further stage of fabrication. III-V semiconductor wafer 12 is bonded to silicon wafer 10 such that planarizable layer 16 is bonded to silicon wafer 10. A thermal or thermo-anodic procedure is used as described above with the first embodiment.

Figure 5:
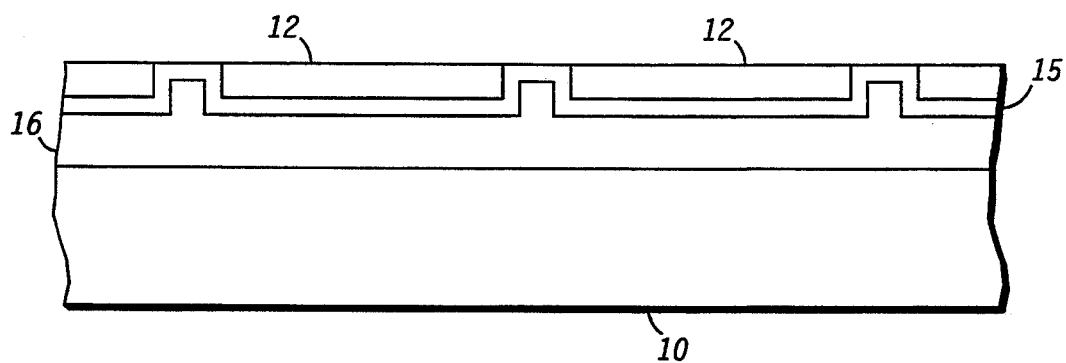
FIG. 5 illustrates the structure of FIG. 4 in a further stage of fabrication.

FIG. 5 illustrates the structure of FIG. 4 further along in processing. After bonding, a portion of III-V semiconductor wafer 12 is removed so that at least a portion of bonding interlayer 15 or planarizable layer 16 is exposed. At this point, it is preferable to expose the two wafers 12 and 10 to a second thermal or thermo-anodic process as described in the first embodiment. Semiconductor devices may then be fabricated in III-V semiconductor wafer 12.

Figure 6:
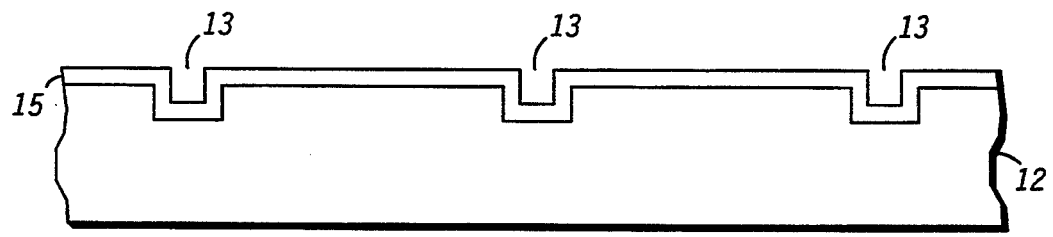
FIG. 6 illustrates a third embodiment of the present invention in a beginning stage of fabrication.

FIG. 6 illustrates a third embodiment of the present invention in a beginning stage of fabrication. III-V semiconductor wafer is shown as in FIG. 3, except that planarizable layer 16 is not formed to refill trenches 13.

Figure 7:
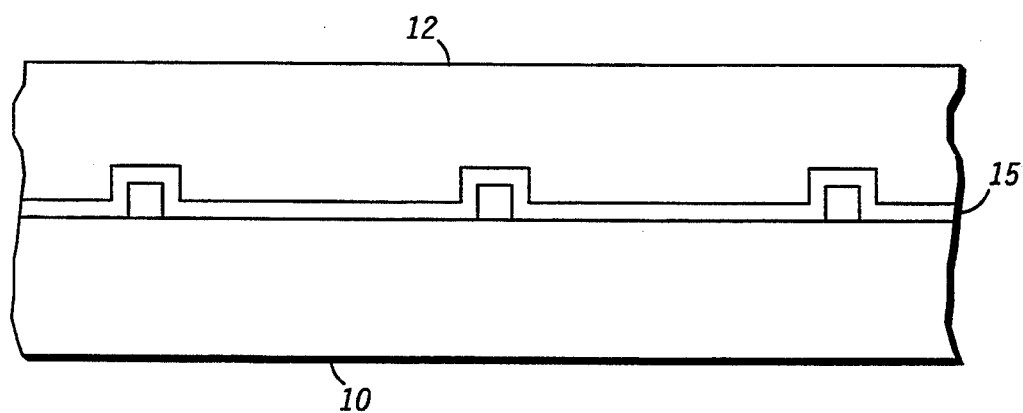
FIG. 7 illustrates the structure of FIG. 6 in a further stage of fabrication.

FIG. 7 illustrates the structure of FIG. 6 further along in processing. III-V semiconductor 12 is then bonded to silicon wafer 10 through bonding interlayer 15 by using the bonding process described previously.

Figure 8:
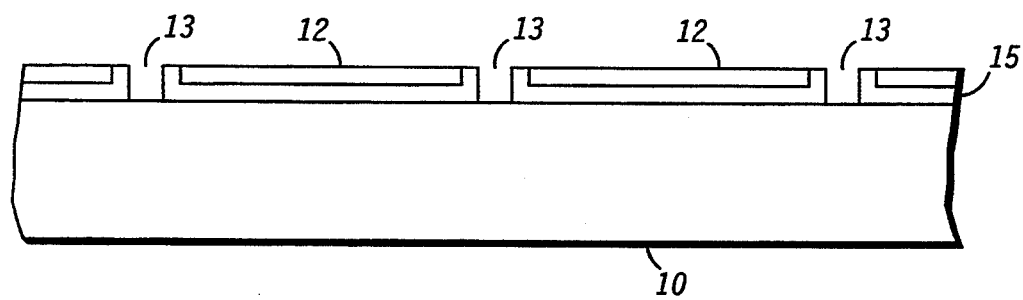
FIG. 8 illustrates the structure of FIG. 7 in a further stage of fabrication.

FIG. 8 illustrates the structure of FIG. 7 further along in processing. As described above, a portion of wafer 12 is removed. Here, a portion of bonding interlayer 15 is also removed such that trenches 13 now form another opening at the bottom of the original opening. This transforms III-V semiconductor wafer 12 into a plurality of III-V semiconductor regions 12 (including bonding interlayer 15).

Figure 9:
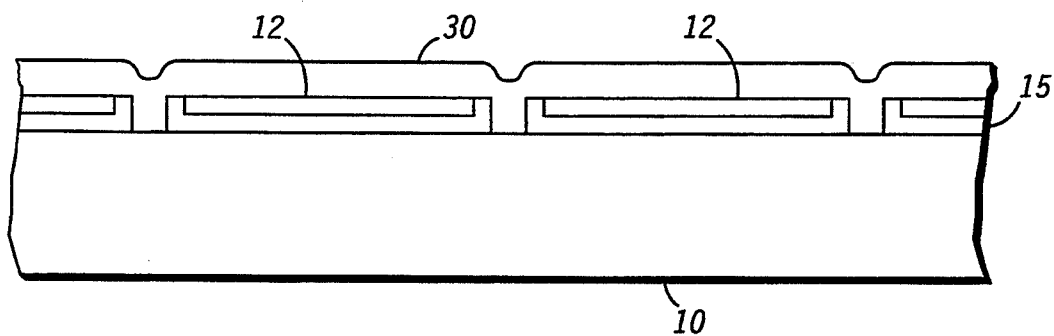
FIG. 9 illustrates the structure of FIG. 8 in a further stage of fabrication.

FIG. 9 illustrates the structure of FIG. 8 further along in processing. FIG. 9 illustrates a first way in which the structure of FIG. 8 may be processed. A dielectric layer 30 is formed in trenches 13 and over wafer 12. Dielectric layer 30 may not be necessary, (air can be used as a dielectric) if III-V semiconductor regions 12 are sufficiently far enough away from each other to provide for electrical isolation.

Figure 10:
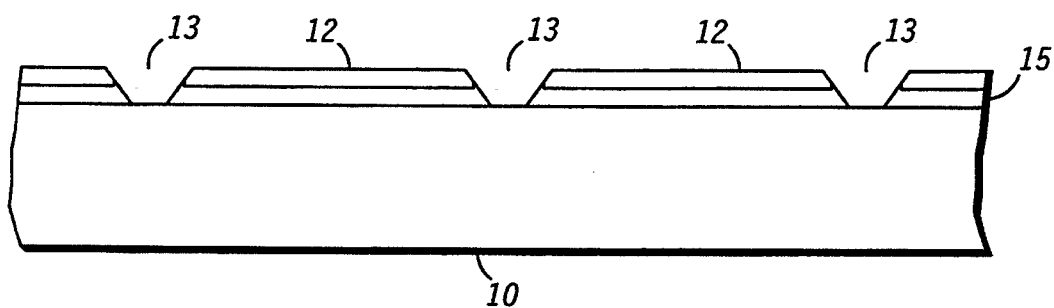
FIG. 10 illustrates the structure of FIG. 8 in a further stage of fabrication.

FIG. 10 illustrates the structure of FIG. 8 further along in processing. FIG. 10 illustrates the second way in which the structure of FIG. 8 may be processed. In this embodiment, the magnitude of maximum stress points are further reduced by altering the sidewall profiles of III-V semiconductor regions 12 so that the sidewalls of each III-V semiconductor region 12 are sloped at approximately 45°. Sloped sidewalls may be formed by using appropriate anisotropic wet etches before or after bonding of III-V semiconductor wafer 12 to silicon wafer 10 or by using an appropriate reactive ion etch after bonding. For example, appropriate anisotropic etches include a bonding interlayer 15 etch followed by a $H_2SO_4:H_2O_2:H_2O$ or $HCl:H_2O_2:H_2O$ etch. For example, appropriate reactive ion etches include $Cl_2$ or $Br_2$ based chemistries. The structure as shown in either FIG. 9 or FIG. 10 (before dielectric layer 30 is formed) is preferably subjected to a thermal or thermal-anodic process to further increase the bond strength.

Figure 11:
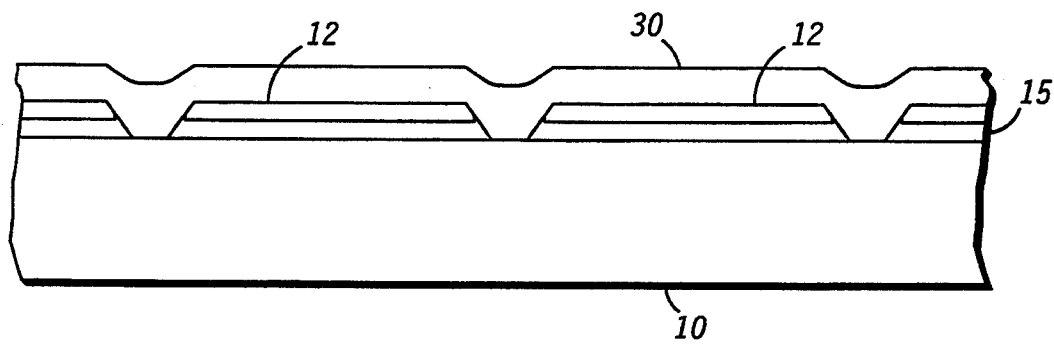
FIG. 11 illustrates the structure of FIG. 10 in a further stage of fabrication.

FIG. 11 illustrates the structure of FIG. 10 further along in processing. As described in FIG. 9, a dielectric layer 30 is formed in trenches 13 and over III-V semiconductor wafer 12. The resulting structure can then be subjected to high temperature processing such as rapid thermal anneal at temperatures of 860° C. or higher, which is used in the formation of semiconductor devices, without stress fracturing III-V semiconductor wafer 12 due to thermal expansion mismatches between silicon wafer 10 and III-V semiconductor wafer 12.

As has been shown, bonding of a silicon wafer to a III-V semiconductor material involves the optimization of the bonding process in order to minimize the stresses involved and provide a sufficiently strong bond. The bonded structure of the present invention provides for a successful, manufacturable method by which VLSI III-V semiconductor devices can be formed alone or integrated with silicon devices.

We claim:

1. A method of bonding a silicon wafer and a III-V semiconductor wafer, comprising the steps of:
   providing a silicon wafer having a first and a second major surface;
   providing a III-V semiconductor wafer having a first and a second major surface;
   forming a bonding interlayer on the first major surface of the III-V semiconductor wafer;
   bonding the silicon wafer and the III-V semiconductor wafer together by using a first thermal or a thermo-anodic bonding process, such that the bonding interlayer is positioned between the III-V semiconductor wafer and the first major surface of the silicon wafer;
   removing a portion of the III-V semiconductor wafer from the second major surface of the III-V semiconductor wafer; and subjecting the III-V semiconductor wafer and the silicon wafer to a second thermal or thermo-anodic bonding process at a temperature less than approximately 200° C. after the step of removing a portion of the III-V semiconductor wafer.

2. The method of claim 1 further comprising removing a portion of the silicon wafer from the second major surface after the step of bonding.

3. The method of claim 1 wherein the step of bonding further comprises bonding at a temperature less than approximately 200° C.

4. The method of claim 1 further comprising the steps of:
   forming a plurality of trenches, each having a bottom, in the first major surface of the III-V semiconductor wafer before the step of forming the bonding interlayer such that the bonding interlayer is also formed in each of the plurality of trenches; forming a planarizable layer on the bonding interlayer on first major surface of the III-V semiconductor wafer and in the trenches; and wherein the step of removing a portion of the III-V semiconductor wafer further comprises removing a portion of the III-V semiconductor wafer down to at least the bottom of each of the plurality of trenches.

5. The method of claim 1 further comprising the steps of:
   forming a plurality of trenches, each having a bottom, in the first major surface of the III-V semiconductor wafer before the step of forming the bonding interlayer such that the bonding interlayer is also formed in each of the plurality of trenches; and wherein the step of removing a portion of the III-V semiconductor wafer further comprises removing a portion of the III-V semiconductor wafer to form a plurality of regions comprised of the III-V semiconductor wafer and the bonding interlayer, wherein the plurality of the regions have sidewalls.

6. The method of claim 5 further comprising altering the sidewalls of the plurality of regions so that the sidewalls are sloped at approximately a 45 degree angle.

7. The method of claim 1 wherein the step of forming the bonding interlayer comprises forming a layer or combination of layers selected from the list of silicon dioxide, doped silicon dioxide, silicon nitride, polysilicon, or amorphous silicon.

8. The method of claim 1 wherein the step of forming the bonding interlayer consists essentially of forming a layer or combination of layers selected from the list of silicon dioxide, doped silicon dioxide, silicon nitride, polysilicon, or amorphous silicon.

9. The method of claim 1 wherein the step of forming the bonding interlayer consists essentially of forming a silicon nitride layer on the III-V semiconductor wafer and a silicon dioxide layer on the silicon nitride layer.

* * * * *